(12) United States Patent
Wang et al.

(10) Patent No.: US 7,872,904 B2
(45) Date of Patent: *Jan. 18, 2011

(54) MAGNETIC RANDOM ACCESS MEMORY

(75) Inventors: Ding-Yeong Wang, Hsinchu County (TW); Yuan-Jen Lee, Taipei County (TW); Chien-Chung Hung, Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 325 days.

This patent is subject to a terminal disclaimer.

(21) Appl. No.: 12/108,498

(22) Filed: Apr. 23, 2008

(65) Prior Publication Data

US 2009/0316472 A1 Dec. 24, 2009

(30) Foreign Application Priority Data

Aug. 9, 2007 (TW) .............................. 96129378 A (51) Int. Cl.
*G11C 11/00* (2006.01)
(52) U.S. Cl. ...................................... 365/158; 365/209
(58) Field of Classification Search ................. 365/158, 365/209
See application file for complete search history.

(56) References Cited

U.S. PATENT DOCUMENTS

| | | | |
|---|---|---|---|
| 6,545,906 B1 | 4/2003 | Savtchenko et al. | |
| 6,633,498 B1 | 10/2003 | Engel et al. | |
| 7,515,458 B2 * | 4/2009 | Hung et al. | 365/158 |
| 7,630,234 B2 * | 12/2009 | Sugibayashi et al. | 365/171 |
| 2002/0036919 A1 * | 3/2002 | Daughton et al. | 365/173 |
| 2005/0226035 A1 * | 10/2005 | Ghodsi | 365/158 |
| 2006/0113619 A1 * | 6/2006 | Hung et al. | 257/421 |
| 2007/0091672 A1 * | 4/2007 | Lin et al. | 365/158 |
| 2007/0281079 A1 * | 12/2007 | Carey et al. | 427/131 |

FOREIGN PATENT DOCUMENTS

JP 2001-338487 12/2001

OTHER PUBLICATIONS

"1st Office Action of China Counterpart Application" issued on Dec. 25, 2009, p. 1-p. 5.

* cited by examiner

*Primary Examiner*—Hoai V Ho
(74) *Attorney, Agent, or Firm*—Jianq Chyun IP Office (57) ABSTRACT

A magnetic random access memory (MRAM) including multiple memory cells for forming an array is provided. Each memory cell has a magnetic free stack layer and a pinned stack layer. A magnetization of the pinned stack layer is set toward a predetermined direction. The magnetic free stack layer has a magnetic easy axis. Two magnetic easy axes of adjacent two memory cells are substantially perpendicular to each other.

18 Claims, 11 Drawing Sheets

MAGNETIC RANDOM ACCESS MEMORY

CROSS-REFERENCE TO RELATED APPLICATION

This application claims the priority benefit of Taiwan application serial no. 96129378, filed on Aug. 9, 2007. The entirety the above-mentioned patent application is hereby incorporated by reference herein and made a part of specification.

BACKGROUND OF THE INVENTION

1. Field of the Invention

The present invention relates to a magnetic random access memory (MRAM).

2. Description of Related Art

A magnetic memory, such as a magnetic random access memory (MRAM), is also a non-volatile memory, which has advantages such as non-volatility, high intensity, fast access speed, and radiation hardness. Data of logic "0" or logic "1" is recorded by the magnitude of magnetoresistance generated by the parallel or anti-parallel management of magnetic moments of magnetic substances adjacent to a tunneling barrier layer. When writing data, a common method is to use two current lines, such as a write bit line (WBL) and a write word line (WWL), to sense magnetic memory cells selected by the intersection of magnetic fields and change the value of the magnetoresistance value by changing the direction of the magnetization of the free layer. When reading memory data, current is allowed to flow into the selected magnetic memory cell, so as to determine the digital value of the memory data according to the read resistance value.

Figure 1:
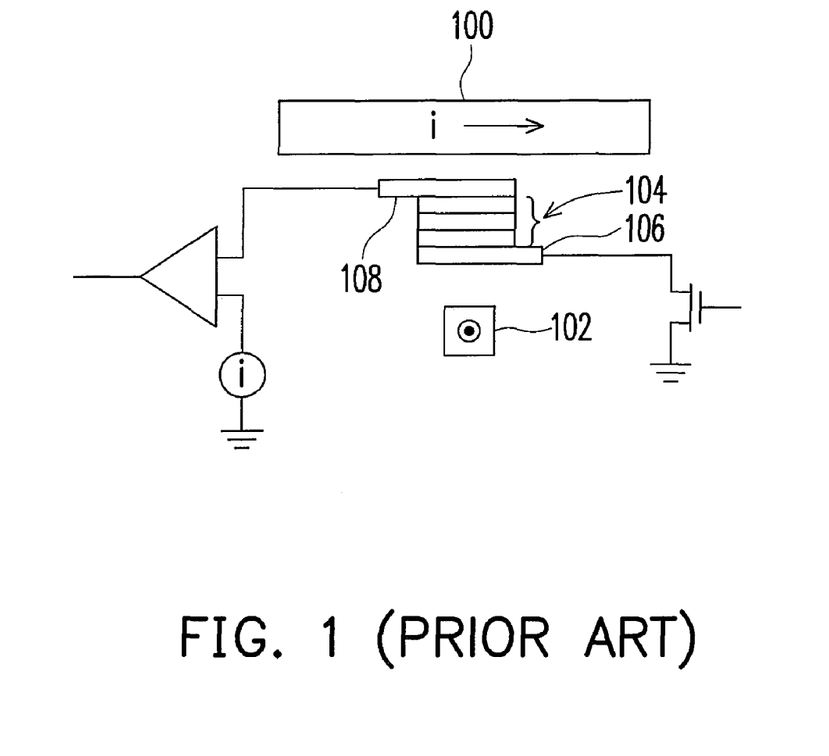
FIG. 1 shows a basic structure of a magnetic memory cell.

FIG. 1 is a basic structure of a magnetic memory cell. Referring to FIG. 1, in order to access a magnetic memory cell to write data, current lines 100 and 102, which are crossed and have suitable current, are required. According to the operation modes thereof, the current lines 100 and 102 may be also referred to as a bit line and a word line. The two lines carrying a current will generate a magnetic field of two directions, so as to obtain a magnetic field having a desired magnitude and direction applied on a magnetic memory cell 104. The magnetic memory cell 104 is a stack layer structure, and includes a magnetic pinned layer having a fixed magnetization or a total magnetic moment in a predetermined direction. An angular difference between the magnetizations of a magnetic free layer and the magnetic pinned layer is used to generate different magnetoresistance values to read data. Further, to write data, a writing magnetic field may also be applied to determine the direction of the magnetization of the magnetic free layer under no magnetic field. The data stored in the memory may be read by output electrodes 106, 108. The operation details of the magnetic memory is familiar to those of ordinary skill in the art and will not be described herein any more.

Figure 2:
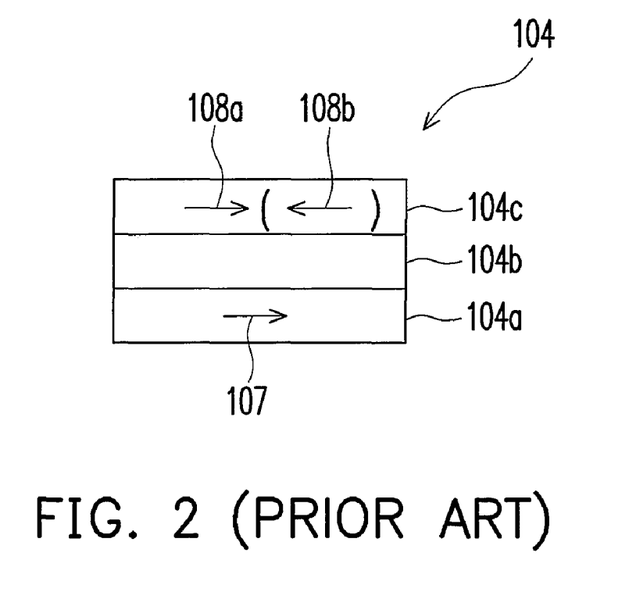
FIG. 2 shows a memory mechanism of a magnetic memory.

FIG. 2 shows a memory mechanism of a magnetic memory. Referring to FIG. 2, the magnetic pinned layer 104a has a fixed magnetic moment direction 107. A magnetic free layer 104c is located above the magnetic pinned layer 104a, and is isolated from it by a tunneling barrier layer 104b disposed between layer 104a and layer 104b. The magnetic free layer 104c has a magnetic moment direction 108a or 108b. The magnetic moment direction 107 is parallel to the magnetic moment direction 108a, so the generated magnetoresistance, for example, represents the data of "0". On the contrary, the magnetic moment direction 107 is anti-parallel to the magnetic moment direction 108b, so the generated magnetoresistance, for example, represents the data of "1."

Figure 3:
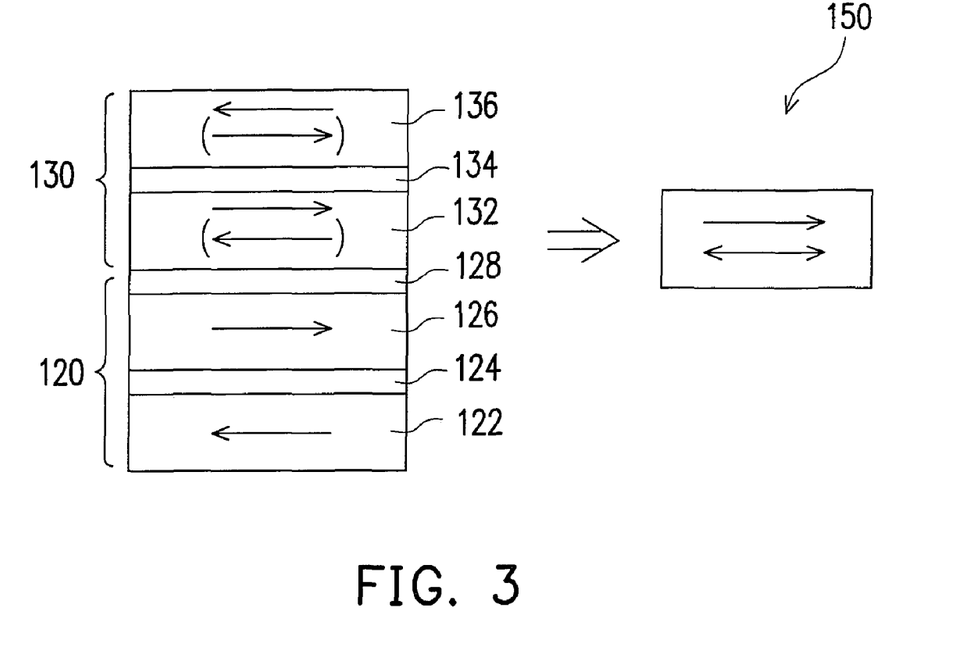
FIG. 3 shows a conventional magnetic memory cell, including a pinned stack layer, a tunneling layer, and a magnetic free stack layer.

The magnetic free layer 104c in FIG. 2 is a single-layer structure, and often causes wrong data in operation. In U.S. Pat. No. 6,545,906, for the free layer, a ferromagnetic/non-magnetic metal/ferromagnetic three-layer structure is used to replace the single layer ferromagnetic material, so as to reduce the interference of adjacent cells when writing data. FIG. 3 shows a structure of a magnetic memory cell, which includes a pinned stack layer 120, a tunneling layer 128, and a magnetic free stack layer 130. The pinned stack layer 120 is including a bottom pinned layer 122, a coupling layer 124, and a top pinned layer 126. The magnetic free stack layer 130 is including a bottom free layer 132, a coupling layer 134, and a top free layer 136. The material of the bottom free layer 132 and the top free layer 136 is, for example, ferromagnetic material, and the material of the coupling layer 134 is, for example, a non-magnetic metal material. The arrows in the drawing represent the directions of the magnetizations. The magnetizations of the bottom pinned layer 122 and the top pinned layer 126 form a magnetic field loop, and will not be influenced by an operation magnetic field. The magnetizations of the bottom free layer 132 and the top free layer 136 are disposed in anti-parallel, and may be influenced by an externally applied operation magnetic field, so as to change stored data. The data depends on the magnetoresistance variation caused by the magnetization between the top pinned layer 126 and the bottom free layer 132. The magnetic easy axis of the bottom free layer 132 of the memory cell and the magnetization of the top pinned layer 126 are parallel or anti-parallel to each other, shown as the pattern 150. The direction of a magnetic anisotropy axis (referred to as a magnetic easy axis for short) is represented by a double arrow, and the magnetization of the top pinned layer 126 is represented by a single arrow.

In order to reduce the interference of adjacent cells when writing data, for the free layer, the ferromagnetic/non-magnetic metal/ferromagnetic three-layer structure is used to replace the single-layer ferromagnetic structure, and the two ferromagnetic layers above and below the non-magnetic metal layer are arranged in anti-parallel. In addition, a toggle mode is used, and the WBL and WWL form an angle of 45 degrees with the magnetic easy axis of the free layer, respectively, and the provided currents are written in a certain sequence. This method may solve the problem of interference efficiently, but cause a problem that a large current is needed to write data.

When the magnetic memory is being designed towards high density, besides the magnetic field for switching must be reduced under the toggle mode, the existing problems still include that adjacent cells are more easily interfered by the magnetic field of the exposed write line when the size is miniaturized. The current free layer is a toggle MRAM structure of the SAF free layer, which is a preferable anti-interference method. However, the operation quadrants of the structures are the same in essence, in relation to the design of a magnetic tunneling junction (MTJ) element, if the exchange coupling J is too small or a bias field caused by an asymmetrical synthetic pinned layer is too large, the anti-interference capability of the MTJ element will be degraded. As a result, the magnetic memory cannot operate normally.

How to solve the interference problem to let the magnetic memory operate normally is a topic that needs further research.

SUMMARY OF THE INVENTION

The present invention is directed to provide a magnetic random access memory (MRAM), which may solve the interference problem efficiently by using adjacent memory cells as reference memory cells, thereby letting the magnetic memory operate normally.

The present invention provides an MRAM, which includes a plurality of memory cells forming an array. Each memory cell has a magnetic free stack layer and a pinned stack layer, and a magnetization of the pinned stack layer is set toward a predetermined direction. The magnetic free stack layer has a magnetic easy axis. The two magnetic easy axes of adjacent two memory cells are substantially perpendicular to each other.

The present invention further provides an MRAM unit, which is controlled by two write word lines and two write bit lines. The MRAM unit includes four memory cells which form a 2×2 array unit, and each memory cell has a magnetic free stack layer and a pinned stack layer, and a magnetization of the pinned stack layer is set toward a predetermined direction. The magnetic free stack layer has a magnetic easy axis. The two magnetic easy axes of adjacent two memory cells are substantially perpendicular to each other.

In order to make the aforementioned and other objects, features and advantages of the present invention comprehensible, preferred embodiments accompanied with figures are described in detail below.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

The magnetic random access memory (MRAM) provided by the present invention at least may solve the problem of mutually interference of the memory cells in operation. The present invention will be illustrated with some embodiments, but not limited thereby.

Figure 4:
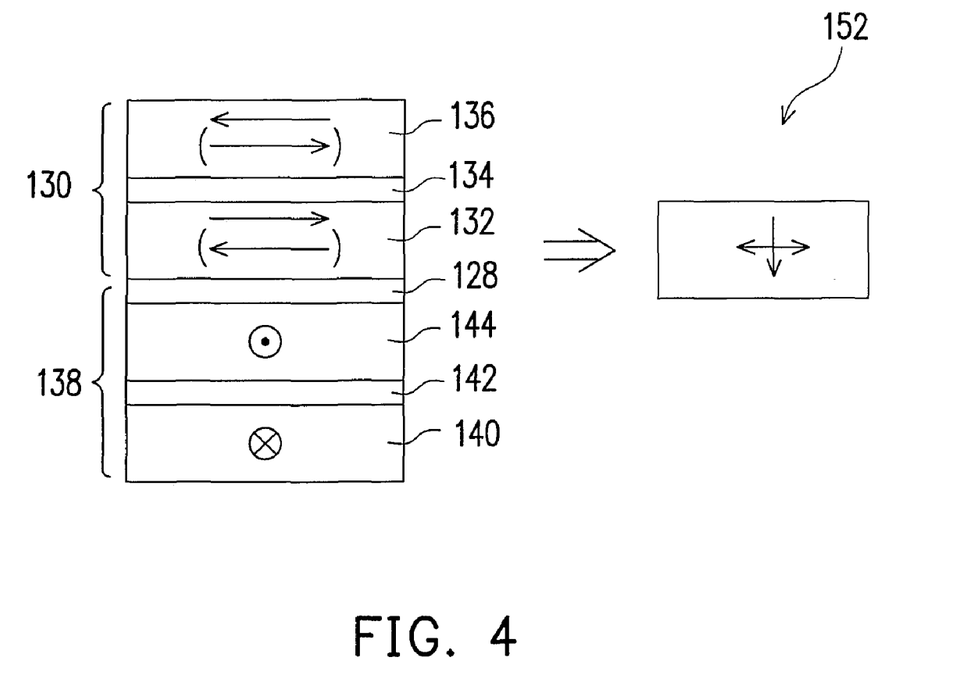
FIG. 4 shows the structure of another magnetic memory cell provided by the present invention, including a pinned stack layer, a tunneling layer, and a magnetic free stack layer.

According to the structure of the magnetic memory cell in FIG. 3, the present invention discloses that a two-dimensional memory cell array may be further formed by the magnetic memory cell and another one. FIG. 4 is a schematic structural view of another magnetic memory cell according to an embodiment of the present invention. Referring to FIG. 4, the structure of the magnetic free stack layer 130 in the another magnetic memory cell is the same as that in FIG. 3, but the direction of the magnetization of the pinned stack layer 138 is substantially perpendicular to the magnetic easy axis of the magnetic free stack layer 130. That is to say, the pinned stack layer 138 is still, for example, a three-layer structure and includes a bottom pinned layer 140, a coupling layer 142, and a top pinned layer 144. The material of the coupling layer 142 is, for example, a non-magnetic metal material. The direction of magnetization of the top pinned layer 144 is substantially perpendicular to the direction of the magnetization of the bottom free layer 132, as shown by the pattern 152. As for the magnetic memory cell, under no external operation magnetic field, the magnetoresistance value formed by the bottom free layer 132 and the top pinned layer 144 is certainly a medium value, and between a parallel magnetoresistance value and an anti-parallel magnetoresistance value. The medium magnetoresistance value serves as a reference value.

The operation of reading the magnetic free stack layer 130 depends on whether the direction of the magnetization is leftward or rightward. An appropriate auxiliary magnetic field is applied when reading data, for example, the magnetizations of the two free layers 132 and 136 of the magnetic free stack layer 130 are horizontally rotated for 90 degrees. If, viewing from a top view (not given), for example, the magnetizations are rotated by 90 degrees in clockwise direction, the magnetization of the bottom free layer 132 is parallel to that of the top pinned layer 144. However, if the magnetization of the bottom free layer 132 is leftward originally, it will be anti-parallel to the magnetization of the top pinned layer 144 after rotating by 90 degrees in clockwise direction. Comparing with the magnetoresistance in the medium state, the data stored in the magnetic free stack layer 130 may be determined.

Figure 5:
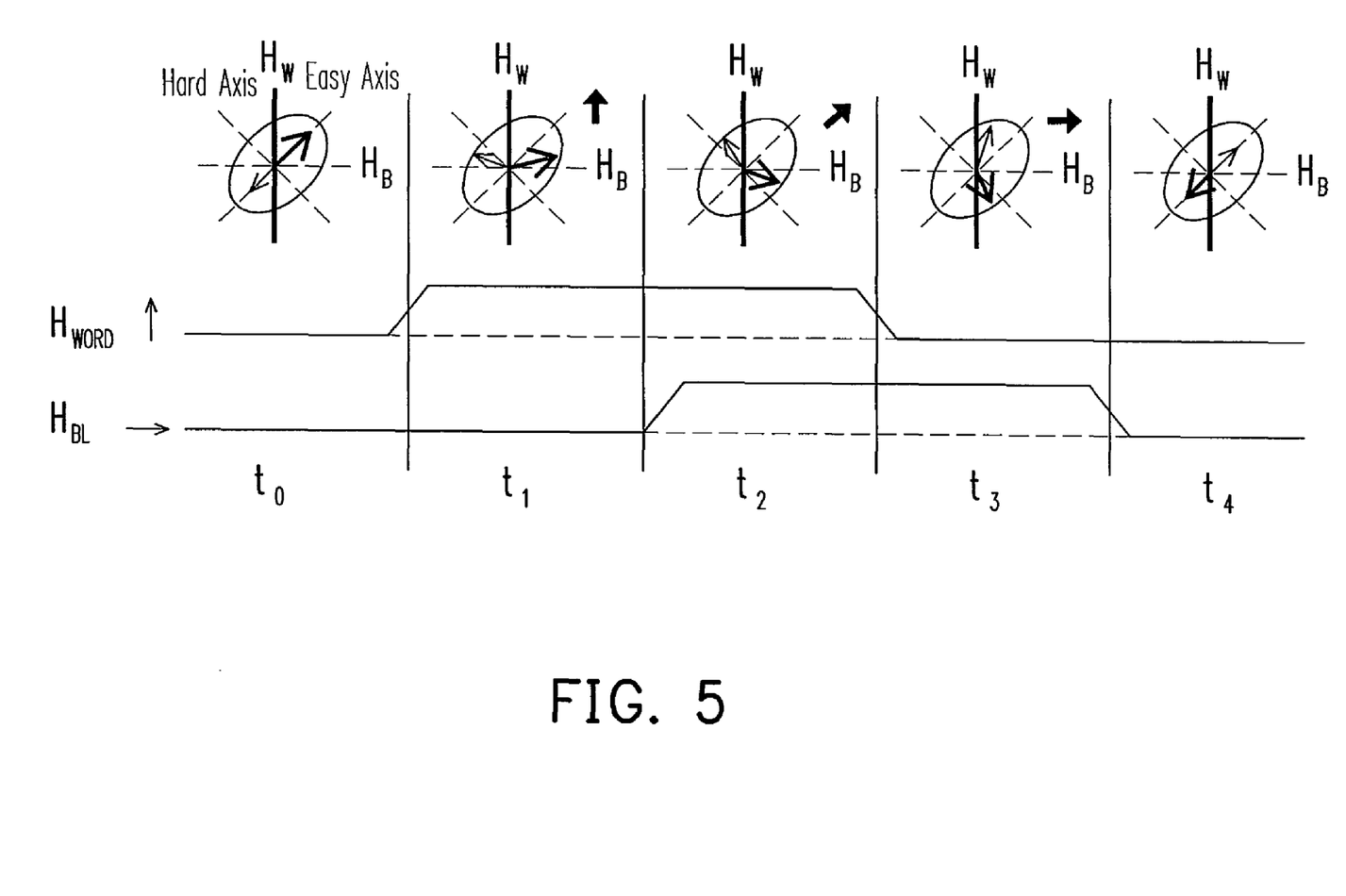
FIG. 5 shows a rotating mechanism of a toggle mode adopted in an embodiment of the present invention.

How to rotate the directions of the magnetizations of the top free layer 136 and the bottom free layer 132 on the magnetic free stack layer 130 will be described in brief. Generally, the rotation of a toggle mode is adopted. FIG. 5 shows a rotating mechanism of a toggle mode adopted in the present invention. Referring to FIG. 5, the following magnetic field waveform is generated by the corresponding word current line and bit current line. Basically, the magnetic field waveform may be divided into five time periods t0-t4. The magnetic field $H_{WORD}$ ($H_W$) generated by the word current line, as shown by the arrow in the figure, is upward. In addition, the direction of the easy axis is defined as 0 degree, and the direction of $H_W$ is +45 degrees. The direction of the magnetic field $H_{BL}$ ($H_B$) generated by the bit current line is −45 degrees, for example, rightward, as shown by the arrow. In the period t0, no external magnetic field is applied. Therefore, the two magnetizations of the magnetic free stack layer 130 are in the easy axis, for example, the magnetization of the bottom free layer is, for example, represented by a thick arrow, and the direction thereof is 0 degree, while the magnetization of the top free layer is represented by a thin arrow and the direction thereof is 180 degrees.

In the period t1, the magnetic field of $H_{WORD}$ is applied. At this time, in order to balance the two magnetizations of the magnetic free stack layer 130 with $H_{WORD}$, the two magnetizations form a tension angle, and form an angle of 90 degrees with the externally applied magnetic field. In the period t2, the magnetic field $H_B$ is applied, and added with the magnetic field $H_W$ to generate a magnetic field having a resultant vector of about 0 degree. Therefore, the two magnetizations are further rotated in a clockwise direction. In the period t3, the magnetic field $H_{WORD}$ is turned off, and only the magnetic field $H_{BL}$ is left. At this time, the direction of the external magnetic field is −45 degrees, i.e., rightward. Then, the two magnetizations are rotated again.

It should be noted that, in the period t3, the magnetization of the thin arrow is close to 0 degree of the easy axis, and on the contrary, the magnetization of the thick arrow is close to 180 degrees of the easy axis. In the period t4, the magnetic field $H_{BL}$ is turned off, and a natural status is recovered. Since there is no externally applied magnetic field, the two magnetizations will be recovered to the closest easy axis, the magnetization of the thin arrow is 0 degree, and the magnetization of the thick arrow is 180 degrees. Compared with the status in the period t0, the status in the period t4 has been rotated for 180 degrees, i.e., has been reversed. The method shown in FIG. 5 is the operation method according to the toggle mode. The magnetizations of the pinned stack layers 120 and 138 are in a fixed direction and will not be changed by any externally applied operation magnetic field. FIG. 5 shows a magnetic field waveform to reverse the magnetization of the free stack layer. In the period t2, the magnetization of the free stack layer is rotated for about 90 degrees. If the magnetization need not be reversed, $H_{BL}$ and $H_{WORD}$ sequentially are stopped according to the sequence of the periods t1 and t0, and then the magnetization of the free stack layer is recovered to the original status.

Figure 6:
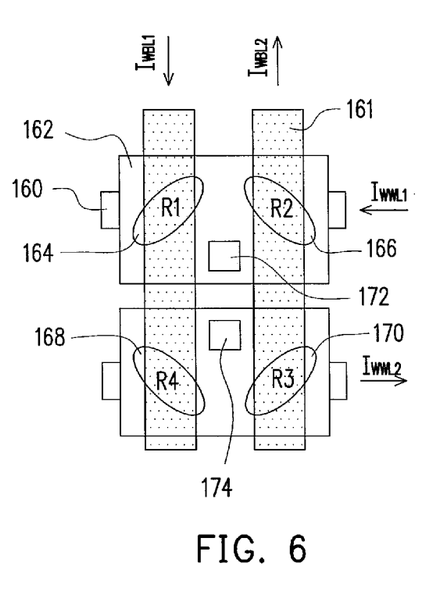
FIG. 6 is a schematic structural view of an array unit according to an embodiment of the present invention.

Then, the structure of the array unit of the memory cell in the present invention will be described below. FIG. 6 is a schematic structural view of an array unit according to an embodiment of the present invention. Referring to FIG. 6, for example, a structure unit is formed by four memory cells 164, 166, 168, and 170, which are driven by two write word lines 160 and two write bit lines 161. The write word lines 160 carry currents $I_{WWL1}$ and $I_{WWL2}$ in the opposite directions, respectively, and the write bit lines 161 also carry currents $I_{WBL1}$ and $I_{WBL2}$ in the opposite directions, respectively. Four memory cells are four magnetic resistors and marked with R1, R2, R3, R4, which form a 2×2 array unit. Each of the memory cells has a magnetic free stack layer and a pinned stack layer. The magnetizations of the pinned stack layers are all set toward a predetermined direction, for example, form an included angle of 45 degrees with the write word lines or the write bit lines. The magnetic free stack layer has a magnetic easy axis. The two magnetic easy axes of the adjacent two memory cells are perpendicular to each other, as shown by the long axes of the ellipses.

In the array unit, for example, the structures of the memory cells R1 and R3 are shown in FIG. 3, while the structures of the memory cells R2 and R4 are shown in FIG. 4. For example, the write word lines 160 are below the memory cells, the write bit lines 161 are above the memory cells, and the write word lines 160 and the write bit lines 161 are perpendicular to each other. The structure layer 162 represents a connection structure of the memory cells, for example, the memory cells R1 and R2 share the same switching transistor 172, and serve as a portion of elements to control reading operation. In addition, the memory cells R3 and R4 share the same switching transistor 174. The method of using the array unit to constitute the circuit in the memory and the operation mode thereof will be described below.

Figure 7:
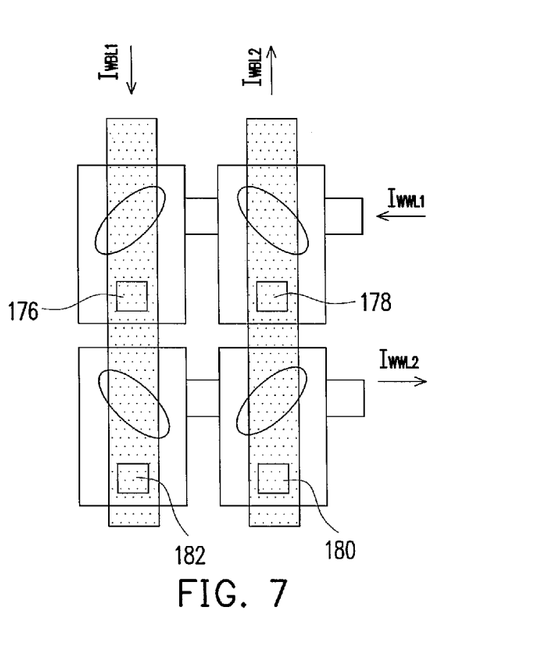
FIG. 7 is a schematic structural view of an array unit according to another embodiment of the present invention.

In addition, in the basic architecture in FIG. 6, the switching transistor may be designed in various ways. FIG. 7 is a schematic structural view of an array unit according to another embodiment of the present invention. Referring to FIG. 7, respective memory cells are connected to switching transistors 176, 178, 180, and 182, which will not influence the basic design of the present invention. In addition, the currents $I_{WWL1}$ and $I_{WWL2}$ of the adjacent two write word lines 160 are in the opposite directions, and the currents $I_{WBL1}$ and $I_{WBL2}$ of the adjacent two write bit lines 161 are in the opposite directions. The current directions in FIGS. 6 and 7 merely represent one embodiment. Furthermore, the directions of the magnetic easy axes of the adjacent two memory cells are opposite, and the arrangement in FIGS. 6 and 7 merely represent one embodiment.

Figure 8:
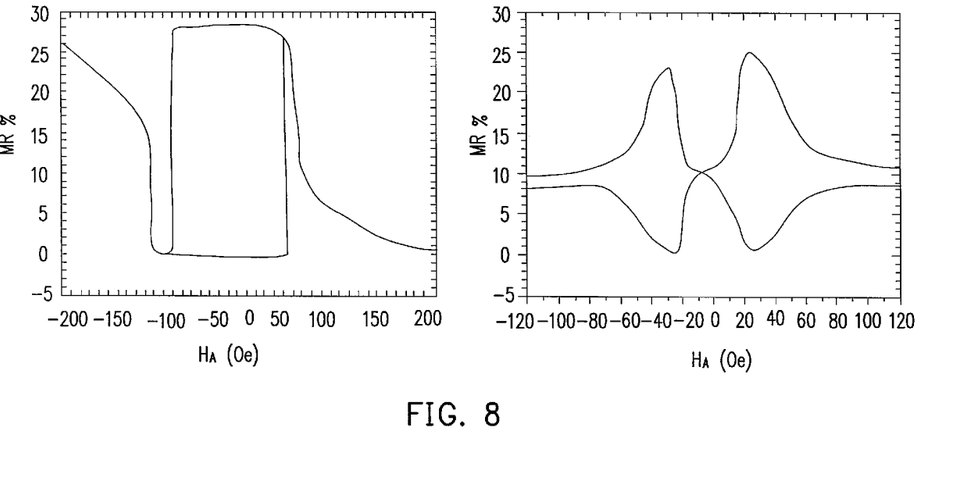
FIG. 8 shows two schematic views of major characteristic curves of R-H loops of adjacent two memory cells in an embodiment of the present invention.

In the writing operation, when the current is applied on the selected write word line and write bit line, besides the memory cells selected at the cross points will sense the practical writing magnetic field, the other memory cells in the write word line and the write bit line will also sense a part of the magnetic field. However, the arrangement of the memory cell array in this embodiment has the effect of reducing interference. FIG. 8 shows two schematic views of major characteristic curves of R-H loops of adjacent two memory cells in an embodiment of the present invention. The horizontal axis represents the variation in the magnetic field, and the longitudinal axis represents a magnetoresistance ratio (MR). The curve at left is an R-H loop (such as R1) of the memory cell which is selected to be written into, and the curve at right represents an R-H loop (such as R2) generated for the adjacent memory cell under the same magnetic field operation waveform. Basically, the adjacent memory cell will suffer little interference. This is because the magnetic easy axes of the adjacent two memory cells are substantially perpendicular to each other.

Figure 9:
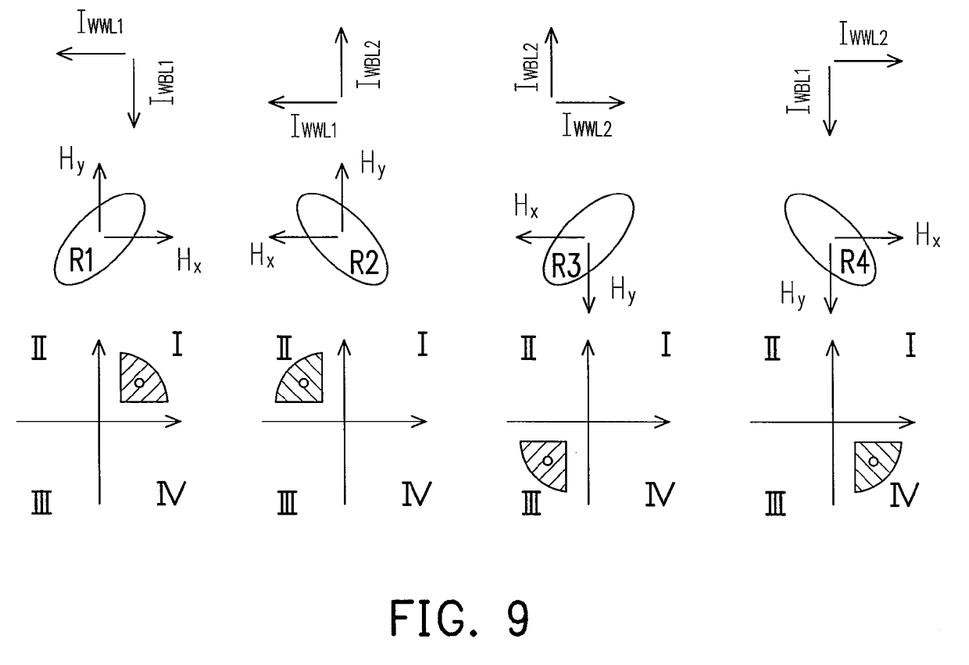
FIG. 9 is a schematic view of the writing operation according to an embodiment of the present invention.

The operating mechanism will be researched in detail, and the reason is concluded as that the four memory cells R1, R2, R3, and R4 are operated in different quadrants, respectively. FIG. 9 is a schematic view of the writing operation according to an embodiment of the present invention. Referring to FIG. 9 together with FIG. 6 or FIG. 7, for example, as shown in the figure, the direction of the current $I_{WBL1}$ of the first write bit line is downward, and the direction of the current $I_{WBL2}$ of the second write bit line is upward. The direction of the current $I_{WWL1}$ of the first write word line is leftward, and the direction of the current $I_{WWL2}$ of the second write word line is rightward. Therefore, the current $I_{WBL1}$ of the first write bit line generates a positive Hx magnetic field for the memory cell R1, and the current $I_{WWL1}$ of the first write word line generates a positive Hy magnetic field for the memory cell R1, and the operation area is in the I quadrant. For the same mechanism, the operation area of the memory cell R2 is in the II quadrant. The operation area of the memory cell R3 is in the III quadrant. The operation area of the memory cell R4 is in the IV quadrant. In this manner, the adjacent memory cells will suffer little interference and may be used as reference memory cells.

Figure 10:
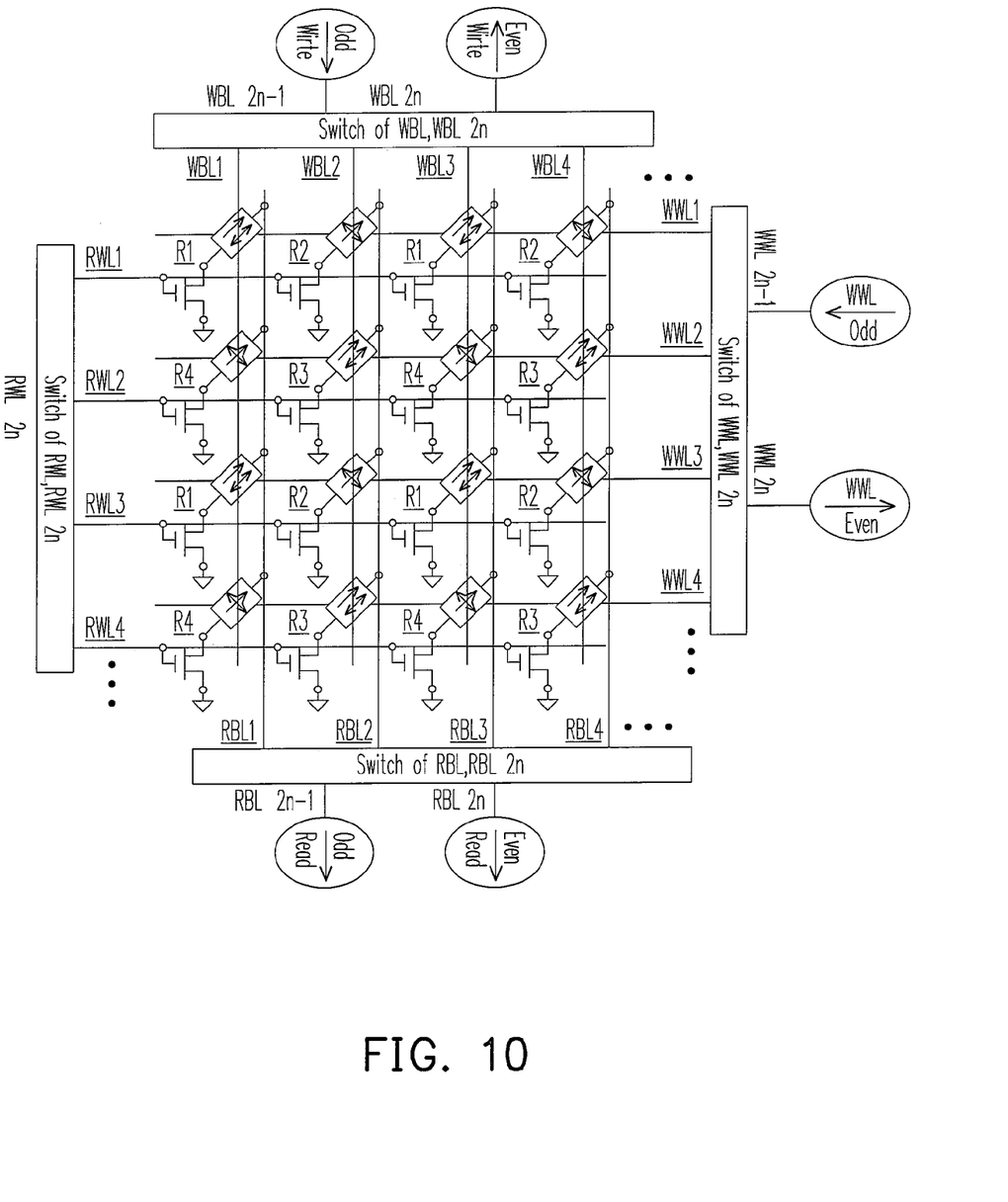
FIG. 10 is a schematic structural view of an array circuit of the magnetic memory according to an embodiment of the present invention.

Therefore, the memory cell array of the practical magnetic memory is formed according to the aforementioned method. FIG. 10 is a schematic structural view of an array circuit of the magnetic memory according to an embodiment of the present invention. Referring to FIG. 10, in point of common characteristics, the MRAM is suitable for a toggle mode. The MRAM includes a plurality of memory cells, which forms a two-dimensional array. Each of the memory cells has a magnetic free stack layer and a pinned stack layer. A magnetization of the pinned stack layer is set toward a same predetermined direction, for example, substantially forms an angle of 45 degrees with the write word line or the write bit line, but little deviation is allowed. The write word line and the write bit line are substantially perpendicular to each other. The magnetic free stack layer of the memory cell has a magnetic easy axis, and the two magnetic easy axes of the adjacent two memory cells are substantially perpendicular to each other.

In this embodiment, for example, as for a 2n×2n array, the odd-numbered rows of memory cells are driven by the odd-numbered write bit lines, and the even-numbered rows of memory cells are driven by the even-numbered write bit lines. The odd-numbered columns of memory cells are driven by the odd-numbered write word lines, and the even-numbered columns of memory cells are driven by the odd-numbered write word lines. The even-numbered write bit lines and the odd-numbered write bit lines have currents with the opposite directions, and the even-numbered write word lines and the odd-numbered write word lines have currents with opposite directions. Basically, the memory cell array includes, for example, the array units in FIG. 6.

The plurality of write word lines, such as WWL1, WWL2, WWL3, and WWL4, is used to respectively apply magnetic fields on the plurality of memory cells in the plurality of columns of the array according to the toggle mode operation. The plurality of write bit lines, such as WBL1, WBL2, WBL3, and WBL4, is substantially perpendicular to the write word lines, so as to respectively apply the magnetic fields on the plurality of memory cells in the plurality of rows of the array according to the toggle mode operation. The predetermined direction of the magnetization of the pinned stack layer of the memory cell substantially forms an angle of 45 degrees with the write word lines. Furthermore, under the toggle mode, the write word lines and write bit lines generate an added magnetic field according to a time sequence, which will rotate the direction of the magnetization of the magnetic free stack layer.

In addition, the MRAM further includes a plurality of read word lines RWL1, RWL2, RWL3, and RWL4, which is respectively coupled to the memory cells in a plurality of columns of the array. Furthermore, a plurality of read bit lines RBL1, RBL2, RBL3, and RBL4, is respectively coupled to the memory cells in a plurality of rows of the array. The read word lines and the read bit lines are used to read a data magnetoresistance of the selected memory cell and a reference magnetoresistance of the adjacent memory cell. The reference magnetoresistance is between a stable high magnetoresistance and a stable low magnetoresistance.

In this embodiment, the adjacent two memory cells may serve as the reference memory cell for each other. For example, when R1 is selected to read a magnetoresistance, R2 serves as a reference memory cell to provide a reference magnetoresistance. Since the magnetoresistance of the selected memory is larger or smaller than the reference magnetoresistance, the two statuses may be used to determine a binary data stored therein.

In addition, according to the design in FIG. 7, for example, each of the memory cells is coupled to a grounding voltage through a switching transistor, respectively. The switching transistor is controlled by, for example, the write word lines, so as to be connected to the grounding voltage. A reading voltage is input through the write bit lines, so as to sense the magnetoresistance.

Figure 11:
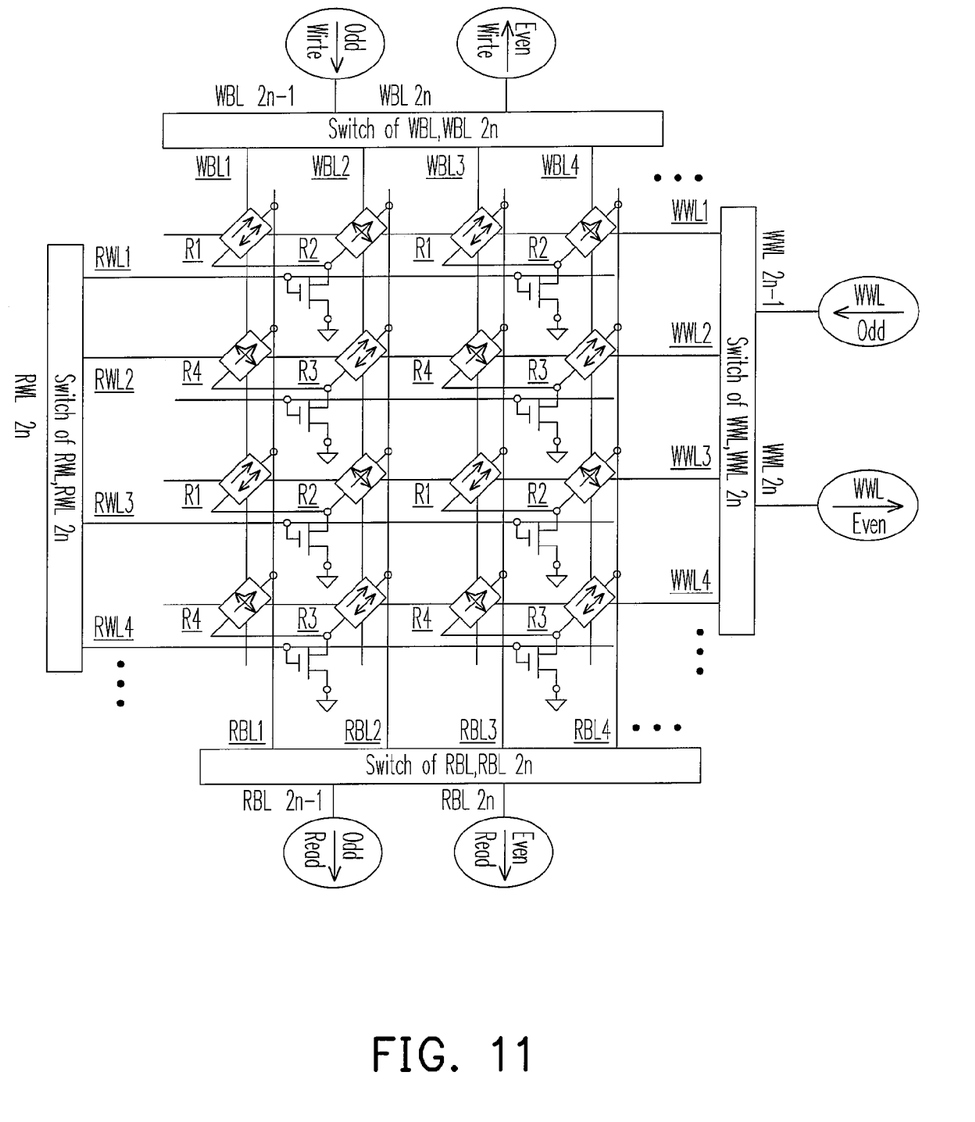
FIG. 11 is a schematic structural view of an array circuit of the magnetic memory according to another embodiment of the present invention.

As described above, each memory cell is coupled to a switching transistor, which, however, is not the only design. FIG. 11 is a schematic structural view of an array circuit of the magnetic memory according to another embodiment of the present invention. Referring to FIG. 11, the structure in FIG. 11 is similar to that in FIG. 10, but the switching transistor is shared by adjacent two memory cells. In other words, the design of the switching transistor may be designed in various ways in consideration of actual requirements, so as to appropriately select the memory cell to be read.

Figure 12:
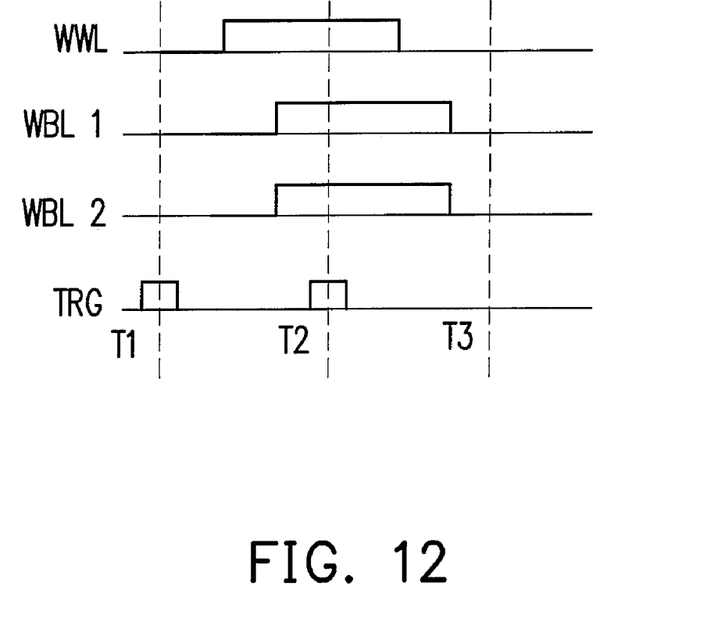
FIGS. 12-15 are schematic views of the operation mechanism of accessing the memory cell according to an embodiment of the present invention.

Subsequently, the magnetic field waveform under the toggle mode is described. FIGS. 12-15 are schematic views of the operation mechanism of accessing the memory cell according to an embodiment of the present invention. Referring to FIG. 12, for example, the memory cells R1 and R2 are selected as a group, and are both driven by the same write word line, but are respectively driven by the odd-numbered write bit line WBL 1 and the even-numbered write bit line WBL 2. At the time point T1, the magnetoresistance values of the memory cells R1 and R2 are first triggered to be read, and R2 serves as a reference value to determine the status of the magnetoresistance of R1. If the data of R1 is the same as the data to be written, the reversal of R1 is unnecessary, and if the data of R1 is different from the data to be written, the reversal of R1 is necessary. The reversal or not will determine the subsequent magnetic field waveform.

Then, according to the toggle operation mechanism in FIG. 5, at the time point T2, the magnetoresistance values of the memory cells R2 and R1 are triggered to be read. At this time, R1 serves as a reference value to determine the status of the magnetoresistance of R2. The trigger time T2 corresponds to the period t2 in FIG. 5, and the magnetization of the free layer of the memory cell R2 is rotated for 90 degrees and is substantially parallel or anti-parallel to the magnetization of the pinned stack layer, and represent the data stored therein. Whether the reversal is necessary should also be determined. If both R1 and R2 need reversal, the magnetic field of WWL should be turned off firstly, and then the magnetic fields of WBL 1 and WBL 2 are turned off. As such, the two memory cells R1 and R2 are both reversed, i.e., the data stored therein is changed. If other memory cells are continued to be written into, the operation is continued at the time point T3. As described above, since the adjacent two memory cells are in different statuses and both have a medium status, the memory cells may serve as a reference memory cell for each other, so as to serve as the reference of determining data.

Figure 13:
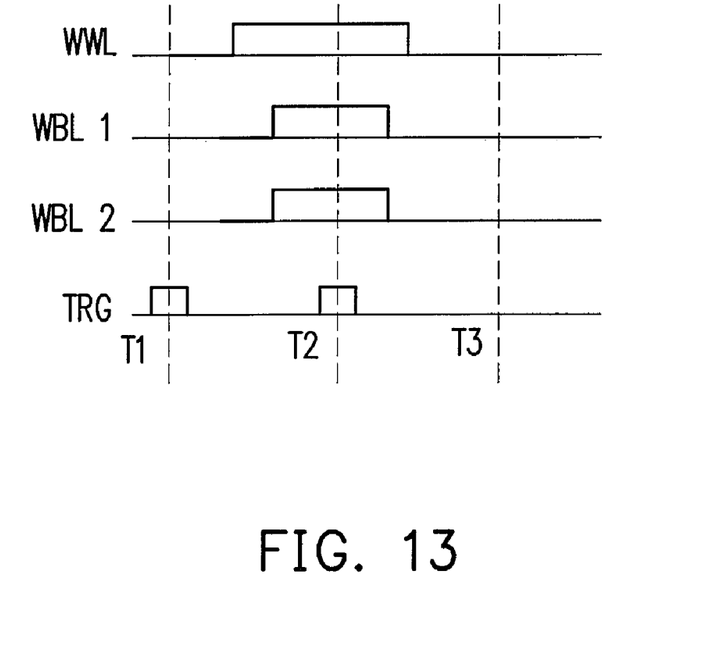

Then, referring to FIG. 13, the operation waveform is a waveform in which neither of the memory cells is reversed, and the main mechanism is to firstly turn off the magnetic fields of WBL 1 and WBL 2, and then recover to the original state in sequence.

Figure 14:
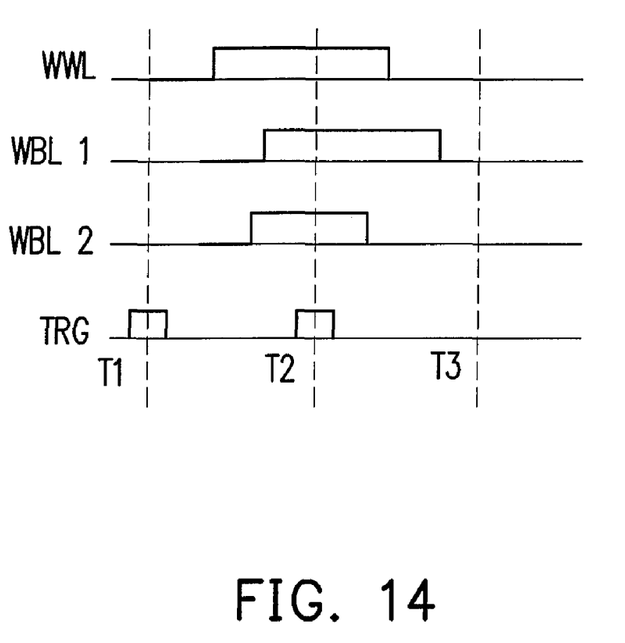
Figure 15:
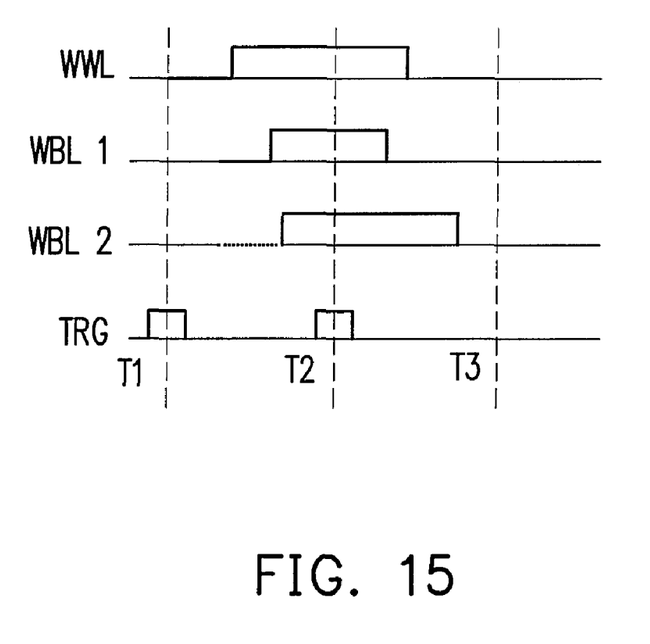

Next, referring to FIG. 14, in such an operation waveform, the memory cell R1 is reversed, and the memory cell R2 is not reversed. Whether the memory cell is reversed is determined based on the sequence of turning off the magnetic fields of the write word lines. Further, referring to FIG. 15, in such an operation waveform, the memory cell R1 is not reversed, and the memory cell R2 is reversed.

The aforementioned operation waveform merely exists in some embodiments, and may be slightly changed in consideration of the reduction of the writing current, but still belong to the reasonable changes of the present invention. Further, although the embodiment of the memory cell does not specifically describe the design with a biased magnetic field, it still falls in the suitable scope of the present invention.

Figure 16:
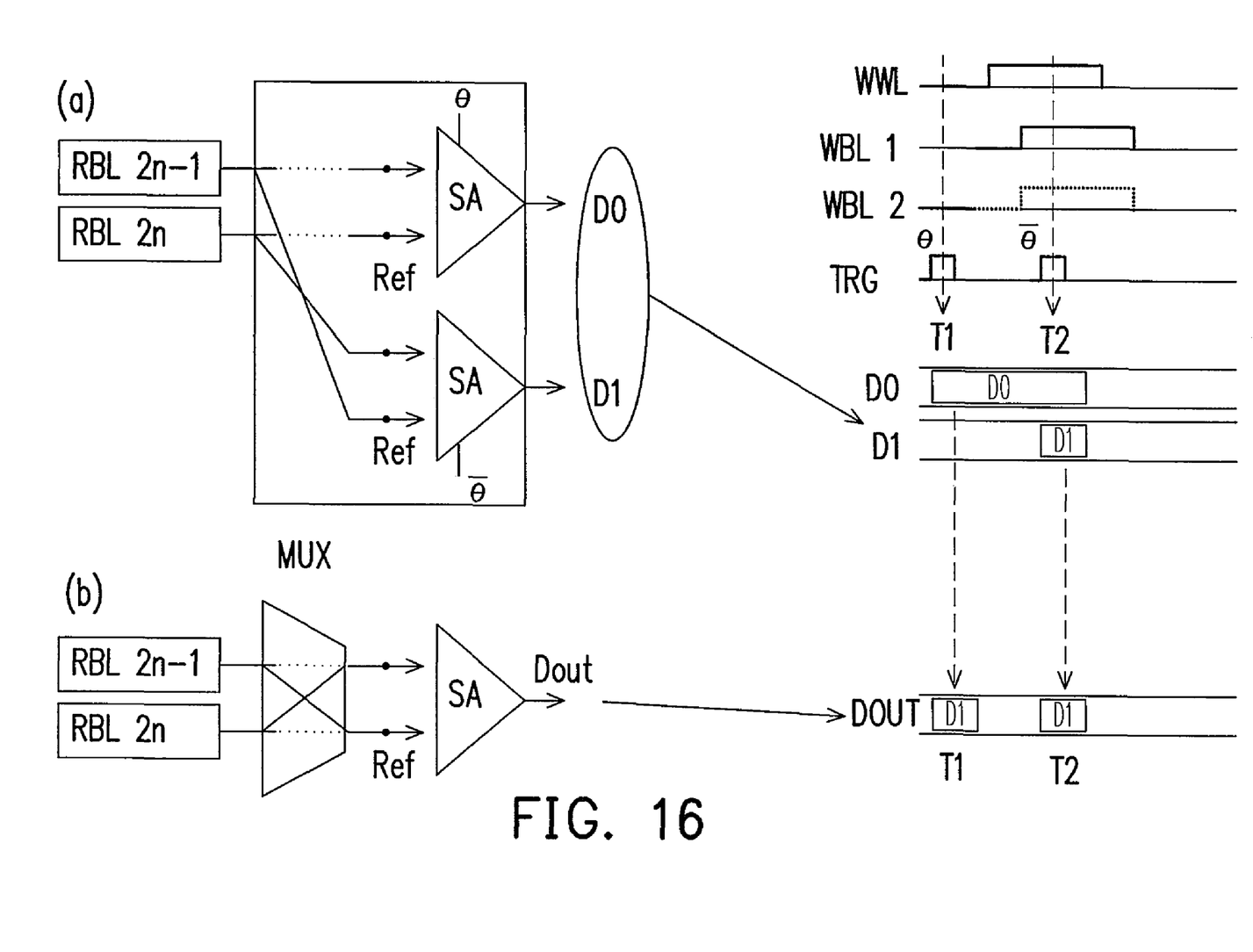
FIG. 16 is a schematic view of the mechanism of reading data according to an embodiment of the present invention.

The reading method will be described as follows. The odd-numbered memory cells and the even-numbered memory cells operate in sync, and there are various reading methods according to practical application. Some embodiments are described as follows. FIG. 16 is a schematic view of the mechanism of reading data according to an embodiment of the present invention. Referring to FIG. 16, as for the method (a), since the adjacent two memory cells may serve as a reference memory cell for each other, at the time point T1, the data D0 is read through a sense amplifier (SA), and at the time point T2, the odd-numbered memory cell is used as a reference, and the data D1 is read through another sense amplifier. In addition, as for the method (b), the data may be output according to different sequences merely by using a sense amplifier through the switching operation of a multiplexer (MUX).

Generally speaking, the following detailed features of the present invention may be concluded.

For example, in the aforementioned embodiments, the MRAM includes a plurality of write word lines, which is used to apply magnetic fields on the plurality of memory cells in the plurality of columns of the array correspondingly and respectively according to a toggle operation magnetic field mode. The plurality of write bit lines is perpendicular to the plurality of write word lines, and is used to apply magnetic fields on the plurality of memory cells in the plurality of rows of the array correspondingly and respectively according to the toggle operation magnetic field mode. The predetermined direction of the magnetization of the pinned stack layer forms an angle of 45 degrees with the plurality of write word lines, and the plurality of write word lines and the plurality of write bit lines generate an added magnetic field according to a time sequence, which may rotate the direction of the magnetization of the magnetic free stack layer.

For example, in the MRAM of the aforementioned embodiments, the current directions of the odd-numbered write word lines and the even-numbered write word lines are opposite to each other, and the current directions of the odd-numbered write bit line and the even-numbered write bit lines are opposite to each other.

For example, in the MRAM of the aforementioned embodiments, the odd-numbered write bit lines generate a positive X-directional magnetic field, and the odd-numbered write word lines generate a positive Y-directional magnetic field. Furthermore, the even-numbered write bit lines generate a negative X-directional magnetic field, and the even-numbered write word lines generate a negative Y-directional magnetic field.

For example, in the MRAM of the aforementioned embodiments, a plurality of read word lines is further included to be respectively coupled to a plurality of memory cells in the plurality of columns of the array. A plurality of read bit lines is respectively coupled to the plurality of memory cells in the plurality of columns of the array. The plurality of read word lines and the plurality of read bit lines are used to read a data magnetoresistance of the selected memory cell and a reference magnetoresistance of the adjacent memory cell.

For example, in the MRAM of the aforementioned embodiments, the reference magnetoresistance is between a stable high magnetoresistance and a stable low magnetoresistance. Furthermore, when one of the adjacent two memory cells is selected to read a magnetoresistance, the other one serves as the reference memory cell to provide a reference magnetoresistance.

The magnetic element provided by the present invention suitable for adjacent reference cell units is a toggle MTJ element including artificial anti-ferromagnetic free layers. Due to the poor anti-parallel coupling between two free layers, the free layers will be reversed 180 degrees under a magnetic field. In the present invention, the directions of the magnetizations of the pinned layers of the adjacent two MTJ elements form an included angle of about 90 degrees with the magnetic easy axis, so that the operation periods of the adjacent MTJ elements differ by one quadrant in essence. Then, an appropriate operation waveform is provided, as shown in FIGS. 12-15, so that adjacent MTJ elements all may serve as a reference unit. Hence, the purposes of anti-interference and preferable impedance matching may be achieved at the same time. Moreover, the data may be output in sync or in a sequence by designing a circuit, as shown in FIG. 16. Further, due to the feature that adjacent MTJ elements may serve as reference, the variation in the process has little influence on the adjacent reference bits. In view of the above-mentioned features, the present invention may be used in a magnetic memory which resists write interference.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A magnetic random access memory (MRAM), comprising:
    a plurality of memory cells, forming an array, wherein each of the memory cells has a magnetic free stack layer and a pinned stack layer, a magnetization of the pinned stack layer is set toward a predetermined direction, and the magnetic free stack layer has a magnetic easy axis,
    wherein two magnetic easy axes of the adjacent two memory cells are substantially perpendicular to each other.

2. The MRAM as claimed in claim 1, further comprising:
    a plurality of write word lines, for correspondingly applying magnetic fields on the memory cells in a plurality of rows of the array according to a toggle operation mode; and
    a plurality of write bit lines, being substantially perpendicular to the write word lines for correspondingly applying magnetic fields on the memory cells in a plurality of columns of the array according to the toggle operation mode,
    wherein the predetermined direction of the magnetization of the pinned stack layer substantially forms an angle of 45 degrees with the write word lines, and an added magnetic field generated by the write word lines and the write bit lines according to a time sequence rotates the direction of the magnetization of the magnetic free stack layer.

3. The MRAM as claimed in claim 1, wherein the two current directions of odd-numbered write word lines and even-numbered write word lines are opposite to each other and the two current directions of odd-numbered write bit lines and even-numbered write bit lines are opposite to each other.

4. The MRAM as claimed in claim 3, wherein the odd-numbered write bit lines generate a positive X-directional magnetic field and the odd-numbered write word lines generate a positive Y-directional magnetic field.

5. The MRAM as claimed in claim 3, wherein the even-numbered write bit lines generate a negative X-directional magnetic field and the even-numbered write word lines generate a negative Y-directional magnetic field.

6. The MRAM as claimed in claim 1, further comprising:
a plurality of read word lines, respectively coupled to the memory cells in the plurality of rows of the array; and
a plurality of read bit lines, respectively coupled to the memory cells in the plurality of columns of the array,
wherein the read word lines and the read bit lines are used to read a data magnetoresistance of the selected memory cell and a reference magnetoresistance of the adjacent memory cell.

7. The MRAM as claimed in claim 6, wherein the reference magnetoresistance is between a stable high magnetoresistance and a stable low magnetoresistance.

8. The MRAM as claimed in claim 1, wherein when one of the adjacent two memory cells is selected to read a magnetoresistance, the other one serves as a reference memory cell to provide a reference magnetoresistance.

9. The MRAM as claimed in claim 8, wherein the magnetoresistance read from the selected memory cell is larger or smaller than the reference magnetoresistance, so as to determine a binary data stored therein.

10. The MRAM as claimed in claim 1, wherein each of the memory cells is coupled to a grounding voltage through a switching transistor.

11. The MRAM as claimed in claim 1, wherein, as for the memory cells in the same row of the array, the adjacent two memory cells are both coupled to a grounding voltage through a switching transistor.

12. A magnetic random access memory (MRAM) unit, controlled by two write word lines and two write bit lines, comprising:
four memory cells forming a 2×2 array unit, wherein each of the memory cells has a magnetic free stack layer and a pinned stack layer, a magnetization of the pinned stack layer is set toward a predetermined direction, and the magnetic free stack layer has a magnetic easy axis,
wherein two magnetic easy axes of the adjacent two memory cells are substantially perpendicular to each other.

13. The MRAM unit as claimed in claim 12, wherein the write word lines and the write bit lines are perpendicular to each other, the predetermined direction of the magnetization of the pinned stack layer substantially forms an angle of 45 degrees with the write word lines, and an added magnetic field generated by the write word lines and the write bit lines according to a time sequence rotates the direction of the magnetization of the magnetic free stack layer.

14. The MRAM unit as claimed in claim 12, wherein when one of the adjacent two memory cells is selected to read a magnetoresistance, the other one serves as a reference memory cell to provide a reference magnetoresistance.

15. The MRAM unit as claimed in claim 14, wherein the magnetoresistance read from the selected memory cell is larger or smaller than the reference magnetoresistance according to a toggle mode operation, so as to determine a stored binary data stored therein.

16. The MRAM unit as claimed in claim 14, wherein each of the memory cells is coupled to a grounding voltage through a switching transistor.

17. The MRAM unit as claimed in claim 14, wherein the two memory cells in the same row are both coupled to a grounding voltage through a switching transistor.

18. The MRAM unit as claimed in claim 14, wherein two current directions of the two write word lines are opposite to each other and two current directions of the two write bit lines are opposite to each other.

* * * * *